(12) United States Patent
Berk et al.

(10) Patent No.: US 9,158,348 B2
(45) Date of Patent: Oct. 13, 2015

(54) SERVER MEMORY COOLING APPARATUS

(75) Inventors: Todd Berk, Burbank, WA (US); Andre S. Eriksen, Morgan Hill, CA (US)

(73) Assignee: ASETEK DANMARK A/S, Aalborg East (DK)

( * ) Notice: Subject to any disclaimer, the term of this patent is extended or adjusted under 35 U.S.C. 154(b) by 197 days.

(21) Appl. No.: 13/538,162

(22) Filed: Jun. 29, 2012

(65) Prior Publication Data

US 2014/0002980 A1 Jan. 2, 2014

(51) Int. Cl.
| | |
|---|---|
| *H05K 7/20* | (2006.01) |
| *G06F 1/20* | (2006.01) |
| *H01L 23/34* | (2006.01) |
| *F28D 15/00* | (2006.01) |

(52) U.S. Cl.
CPC ........ *G06F 1/20* (2013.01); *F28D 15/00* (2013.01); *H01L 23/34* (2013.01); *H05K 7/20309* (2013.01); *G06F 2200/201* (2013.01)

(58) Field of Classification Search
CPC ........ G06F 1/20; H05K 7/20; H05K 7/20309; H05K 7/20936; H01L 23/24; H01L 23/473; H01L 23/4735; F25D 3/00; F25D 15/00; F28F 7/00
USPC ........ 361/679.46–679.54, 688, 689, 361/698–702, 704–712, 715, 719–727; 165/80.2–80.5, 104.14, 104.21, 165/104.33, 104.34, 185; 62/259.2; 174/15.1, 15.2, 16.3, 252
See application file for complete search history.

(56) References Cited

U.S. PATENT DOCUMENTS

| | | | | |
|---|---|---|---|---|
| 3,524,497 | A * | 8/1970 | Chu et al. | 165/80.4 |
| 6,421,240 | B1 * | 7/2002 | Patel | 361/699 |
| 6,496,375 | B2 * | 12/2002 | Patel et al. | 361/719 |
| 6,655,449 | B1 * | 12/2003 | Hsien | 165/80.4 |
| 6,667,882 | B2 * | 12/2003 | Pauser | 361/695 |
| 6,853,554 | B2 * | 2/2005 | Bash et al. | 361/699 |
| 7,151,668 | B1 * | 12/2006 | Stathakis | 361/700 |
| 7,286,355 | B2 * | 10/2007 | Cheon | 361/699 |
| 7,312,987 | B1 * | 12/2007 | Konshak | 361/679.48 |
| 7,855,888 | B2 * | 12/2010 | Peterson | 361/699 |
| 7,907,398 | B2 * | 3/2011 | Hrehor et al. | 361/679.53 |
| 7,933,125 | B2 * | 4/2011 | Wei et al. | 361/699 |
| 7,957,134 | B2 | 6/2011 | Farnsworth et al. | |
| 7,965,509 | B2 * | 6/2011 | Campbell et al. | 361/699 |
| 7,969,736 | B1 * | 6/2011 | Iyengar et al. | 361/699 |
| 8,004,841 | B2 * | 8/2011 | Cipolla et al. | 361/699 |
| 8,027,162 | B2 * | 9/2011 | Campbell et al. | 361/699 |

(Continued)

FOREIGN PATENT DOCUMENTS

WO WO 2011/053307 A1 5/2011

OTHER PUBLICATIONS

PCT International Search Report and PCT Written Opinion of the International Searching Authority for corresponding PCT application PCT/IB2013/002453, mailed Feb. 6, 2014, (11 pages total).

*Primary Examiner* — Michail Datskovskiy
(74) *Attorney, Agent, or Firm* — Finnegan, Henderson, Farabow, Garrett & Dunner LLP.

(57) ABSTRACT

A system to aid in cooling an in-line memory module may include a heat spreader including a channel to accommodate the in-line memory module, thermal interface material, and a liquid-cooler block including a heat-conducting cold plate and an internal liquid channel filled with circulating cooling liquid. Also disclosed are systems employing tubes to convey cooling fluid.

28 Claims, 8 Drawing Sheets

(56) References Cited

U.S. PATENT DOCUMENTS

| | | | |
|---|---|---|---|
| 8,066,057 B2* | 11/2011 | Olesen | 165/80.4 |
| 8,081,473 B2* | 12/2011 | Cipolla et al. | 361/719 |
| 8,125,780 B2 | 2/2012 | Goth et al. | |
| 8,238,101 B2* | 8/2012 | Kalms et al. | 361/700 |
| 8,385,067 B2* | 2/2013 | Arvelo et al. | 361/699 |
| 8,385,069 B2* | 2/2013 | Iyengar et al. | 361/700 |
| 8,493,738 B2* | 7/2013 | Chainer et al. | 361/700 |
| 8,570,744 B2* | 10/2013 | Rau et al. | 361/702 |
| 8,587,943 B2* | 11/2013 | Barina et al. | 361/699 |
| 8,599,557 B2* | 12/2013 | Peterson et al. | 361/699 |
| 8,638,559 B2* | 1/2014 | Barina et al. | 361/704 |
| 8,649,177 B2* | 2/2014 | Chainer et al. | 361/700 |
| 8,659,897 B2* | 2/2014 | Meijer et al. | 361/699 |
| 8,913,384 B2* | 12/2014 | David et al. | 361/679.53 |
| 2004/0182544 A1* | 9/2004 | Lee et al. | 165/80.4 |
| 2005/0117298 A1 | 6/2005 | Koga et al. | |
| 2006/0007720 A1* | 1/2006 | Pfeifer et al. | 363/141 |
| 2006/0098409 A1* | 5/2006 | Cheon | 361/699 |
| 2006/0250772 A1* | 11/2006 | Salmonson et al. | 361/698 |
| 2006/0291165 A1* | 12/2006 | Flesch et al. | 361/699 |
| 2008/0084664 A1 | 4/2008 | Cambell et al. | |
| 2009/0002951 A1* | 1/2009 | Legen et al. | 361/715 |
| 2009/0080151 A1* | 3/2009 | Kalms et al. | 361/679.52 |
| 2009/0277616 A1* | 11/2009 | Cipolla et al. | 165/104.33 |
| 2009/0323286 A1* | 12/2009 | Han | 361/702 |
| 2010/0085712 A1* | 4/2010 | Hrehor et al. | 361/699 |
| 2010/0091447 A1* | 4/2010 | Jaggers et al. | 361/679.47 |
| 2010/0175852 A1* | 7/2010 | Peterson | 165/80.2 |
| 2010/0252234 A1* | 10/2010 | Cambell et al. | 165/80.2 |
| 2011/0069454 A1* | 3/2011 | Campbell et al. | 361/700 |
| 2012/0020004 A1 | 1/2012 | Rau et al. | |
| 2012/0020022 A1* | 1/2012 | Peterson et al. | 361/699 |
| 2012/0152500 A1* | 6/2012 | Kao et al. | 165/109.1 |
| 2013/0027870 A1* | 1/2013 | Goldr an et al. | 361/679.32 |
| 2013/0135812 A1* | 5/2013 | Barina et al. | 361/679.32 |
| 2013/0194745 A1* | 8/2013 | Meijer et al. | 361/679.47 |
| 2013/0342987 A1* | 12/2013 | Yang et al. | 361/679.32 |

* cited by examiner

SERVER MEMORY COOLING APPARATUS

BACKGROUND OF THE INVENTION

A. Field of the Invention

The present disclosure is related generally to liquid cooling systems for cooling heat-generating components of a computer, server or other data processing devices and systems.

B. Description of the Prior Art

Electronic systems, such as, for example, computer systems include several integrated circuit (IC) devices that generate heat during operation. For effective operation of the computer system, the temperature of the IC devices has to be maintained within acceptable limits. While the problem of heat removal from IC devices is an old one, this problem has increased in recent years due to greater numbers of transistors that are packed into a single IC device while reducing the physical size of the device. Increasing the number of transistors compacted into a smaller area results in a greater concentration of heat that must be removed from that smaller area. Bundling multiple computer systems together, such as, for example, in a server, further aggravates the heat removal problem by increasing the amount of heat that has to be removed from a relatively small area.

One known component of a computer system which includes IC devices is an in-line memory module. These modules come in various configurations, such as single in-line memory modules (SIMMs) or dual in-line memory modules (DIMMs), such as synchronous dynamic random access memory (SDRAM) DIMMs or double data rate (DDR) SDRAM DIMMs. Through Silicon Via (TSV) memory modules, or multi-die dynamic memory (DRAM) packaged memory modules. In-line memory modules include a series of ICs mounted on a printed circuit board, connected to other electrical components. The printed circuit board usually plugs into another printed circuit board, such as a motherboard, and transmits data to a processor. DIMMs come in different heights. One of the standard heights of DIMMs is "Low Profile" (LP) which measures about 30 mm. Another standard height is "Very Low Profile" (VLP) which measures about 18.75 mm. Both the LP and the VLP DIMMs have the same width and pinout, allowing substitution of one with the other, overhead space permitting.

In contrast, there are no standards for the space surrounding DIMMs in a computer system. The space between one DIMM and another, the location of a DIMM, the latches to keep the DIMM secured, and the connector with which the DIMM plugs into the motherboard, all have variable dimensions, from computer system to computer system. Often DIMMs are located close to a processor which itself generates a significant amount of heat. If a DIMM becomes too warm, for example above a $T_{case}$ by a defined threshold, such as 85 degrees Celsius, data bits are at a higher risk of corruption. Such thresholds can vary according to the specific DIMM or other electronics part or module at issue.

Prior art cooling systems are predominantly air-cooling systems with fans. These systems require relatively large amounts of space and prevent compactness in overall device or system design. Disadvantageously, air-cooling systems generate a great deal of noise, are energy inefficient, and are susceptible to mechanical failures. In addition, the density of components in current systems obstructs the flow of air, reducing the heat-removing efficacy of such cooling systems.

The disclosed cooling systems and methods are directed to an energy efficient approach of cooling one or more servers located in an enclosed environment, such as a server room, and include fluid connectors for connecting and disconnecting fluid conduits of the cooling systems.

SUMMARY OF THE INVENTION

According to one embodiment of the disclosure, a system to aid in cooling an in-line memory module may include a heat spreader and a liquid-cooler block, wherein the heat spreader and the liquid-cooler block are in thermal communication. The heat spreader is configured to attach to an in-line memory module. The heat spreader may include a channel which can accommodate the in-line memory module. Heat that is generated from the memory module is transferred to the heat spreader, and then to the liquid-cooler block via a heat-conducting cold plate of the liquid-cooler block. The liquid-cooler block includes an internal liquid channel, which holds a circulating cooling liquid and is in thermal communication with the cold plate. The heat, which originated from the in-line memory module and subsequently transferred to the cold plate of the liquid-cooler block, is removed by cooling liquid circulating in the liquid channel. In this manner, the temperature of the in-line memory module can be maintained within a necessary specification for proper functioning of the memory.

According to another embodiment of the disclosure, the heat spreader is in sufficient thermal communication with the in-line memory module and with the liquid-cooler block, such that the mean temperature of the in-line memory module remains within 8 degree Celsius of the circulating cooling liquid in the liquid-cooler block.

According to another embodiment, this thermal communication is aided by thermal adhesive between the heat spreader and the in-line memory module, by a thermal interface material like a gap pad between the heat spreader and the liquid-cooler block, and by a securing mechanism to bias an exterior surface of the cold plate of the liquid-cooler block into thermal communication with the heat spreader.

According to yet another embodiment, the cooling system comprising the combination of heat spreader and liquid-cooler block fits in the height difference between a conventional LP DIMM of a height of 30 mm and a convention VIP DIMM of 18.75 mm. By engaging or disengaging the securing mechanism which maintains the exterior surface of the cold plate of the liquid-cooler block in thermal communication with the heat spreader, the liquid-cooler block can be removed and replaced for simple access to and replacement of the in-line memory module.

According to another embodiment, the system comprises a plurality of heat spreaders, each attached to a plurality of in-line memory modules, in thermal communication with the liquid-cooler block.

According to some other embodiments of the disclosure, a thermal management system and a thermal management apparatus, to aid in cooling an in-line memory module may include a manifold comprising a plurality of parallel heat-conducting cooling tubes carrying a cooling liquid along the length of the memory module, from an inlet to an outlet. The heat-conducting cooling tubes are in thermal communication with in-line memory modules, along the length of the memory module. The spacing between the cooling tubes are configured to fit the in-line memory module between any two of the cooling tubes.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the disclosure, as claimed.

The accompanying drawings, which are incorporated in and constitute a part of this specification, illustrate several embodiment of the disclosure and together with the description, serve to explain the principles of the disclosure.

BRIEF DESCRIPTION OF THE DRAWINGS

It is to be understood that the following detailed description is exemplary and explanatory only and is not restrictive of any invention, as claimed. The accompanying drawings, which are incorporated in and constitute a part of this specification, illustrate several embodiments of the inventions and together with the description, serve to explain the principles of the inventions. In the drawings:

DESCRIPTION OF ILLUSTRATIVE EMBODIMENT(S)

Figure 1:
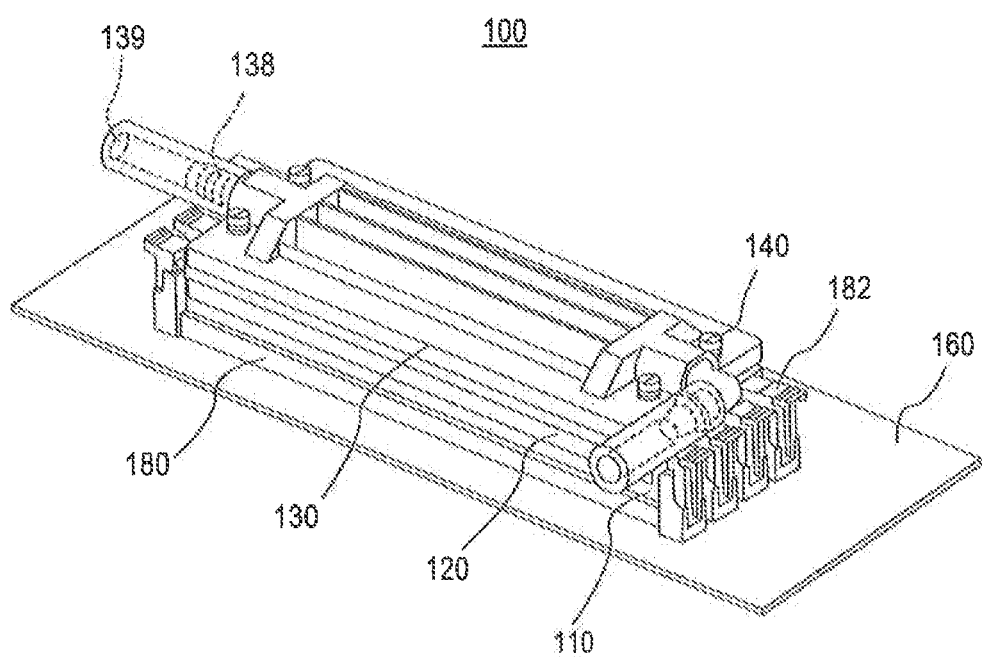
FIG. 1 is a perspective view of a thermal management system in accordance with one illustrative embodiment of this disclosure.

For simplicity and clarity of illustration, reference numerals may be repeated among the figures to indicate corresponding or analogous elements. Also, similarly-named elements perform similar functions and are similarly designed, unless specified otherwise. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

FIG. 1 is a perspective view of a thermal management system 100 in accordance with one embodiment of this disclosure. System 100 comprises in-line memory modules 110, heat spreader 120, liquid-cooler block 130, and securing mechanism 140. In-line memory module 110 connects to printed circuit board 160 via in-line memory module socket 180. Socket latch 182 secures in-line memory module 110 in the in-line memory module socket 180. The liquid-cooler block 130 is retained on the in-line memory module 110 by securing mechanism 140. Liquid inlet or outlet 138 of the liquid-cooler block 130 interfaces with tubing 139, which carries cooling liquid in or out of the liquid-cooler block 130.

In some embodiments, system 100 is part of a computer system. In some embodiments, in-line memory module 110 is a standard in-line memory module used in computers and other electronic devices. In other embodiments, in-line memory module 110 is a dual in-line memory module (DIMM). In some embodiments, in-line memory module 110 is a Low Profile (LP) DIMM with a height of 30 mm. In other embodiments, the in-line memory module 110 is a Very Low Profile (VLP) DIMM with a height of 18.75 mm. Of course, other dimensions, standard or otherwise, are envisioned.

In some embodiments, the printed circuit board 160 is a motherboard, and the in-line memory module socket 180 is a DIMM socket capable of receiving DIMMs. The in-line memory module 110 communicates with devices and components connected to the motherboard, including a processor. In other embodiments, tubing 139 conveys cooling liquid which cools the in-line memory module 110, and cools other components and devices of the computer system, including the processor, in a liquid loop. The liquid loop cools various components in the computer system by carrying away the heat in the cooling liquid until a fixed point in the loop, where the heat is transferred external to the computer system. The cooling liquid is cooled down, and re-circulates in the liquid loop to further remove heat from various components, including in-line memory module 110. In some embodiments, the cooling liquid is water, although in other embodiments, it is obvious that other liquids could be used as the cooling liquid.

Figure 2:
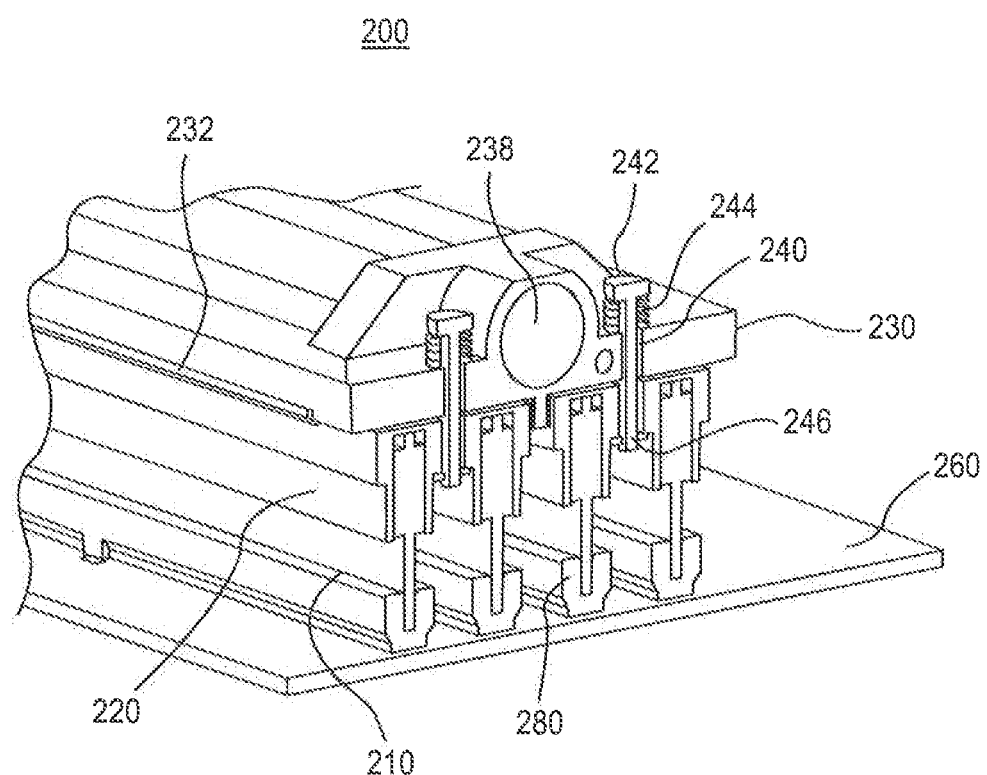
FIG. 2 illustrates a cross-section perspective view of an embodiment of a thermal management system in accordance with one exemplary embodiment of this disclosure.

FIG. 2 is a closer cross-section perspective view of a thermal management system 200 in accordance with some embodiments of this disclosure. System 200 comprises in-line memory modules 210, heat spreader 220, liquid-cooler block 230, and securing mechanism 240. In some embodiments, liquid-cooler block 230 includes heat-conducting cold plate 232 and liquid inlet or outlet 238. In other embodiments, securing mechanism 240 includes an engagement mechanism 246, a force mechanism 244, and a means 242 to engage or disengage the securing mechanism 240 with or from heat spreader 220. In-line memory socket 280 is shown, as well as printed circuit board 260.

In some embodiments, in-line memory module 210 is as described for system 100. In-line memory module 210 is outlined in FIG. 2 to indicate integrated circuit (IC) devices protruding from a printed circuit board which the IC devices mount. In other embodiments, system 200 comprises a plurality of in-line memory modules 210, each attached to heat spreaders 220. In some embodiments, heat spreader 220 is attached onto in-line memory module 210 with thermal adhesive. The thermal adhesive enhances thermal communication between in-line memory module 210 and heat spreader 220, improving conduction of heat from memory module 210 to heat spreader 220. In some embodiments, heat spreader 220 comprises a channel the length of in-line memory module 210, within which it accommodates in-line memory module 210. In other embodiments, heat spreader 220 is in intimate contact with the full widths and lengths of the IC devices of in-line memory module 210, along the whole length of memory module 210.

The top surfaces of heat spreaders 220 interfaces with the liquid-cooler block 230. Liquid-cooler block 230 comprises heat-conducting cold plate 232. In some embodiments a thermal interface material is disposed between the heat spreader 220 and the exterior surface of heat-conducting cold plate 232. The thermal interface material enhances thermal communication between heat spreader 220 and exterior surface of heat-conducting cold plate 232, improving conduction of heat from heat spreader 220 to heat-conducting cold plate 232. In some embodiments, heat-conducting cold plate 232 is made of aluminum. In other embodiments, heat-conducting cold plate 232 is made of a heat-conducting material.

Securing mechanism 240 retains liquid-cooler block 230 on heat spreaders 220. In some embodiments, securing mechanism 240 also aids thermal communication between heat spreaders 220 and an exterior surface of a heat-conducting cold plate 232 of the liquid-cooler block 230. Engagement mechanism 246 provides engagement of securing mechanism 240 with heat spreader 220. Force mechanism 244 provides a force biasing heat spreader 220 into thermal communication with heat-conducting cold plate 232. In some embodiments, a retention lock is engagement mechanism 246, a spring is force mechanism 244, and a thumb screw is means for engaging or disengaging 242 the engagement mechanism 246 of securing mechanism 240 with or from heat spreader 220, as illustrated in FIG. 2. The thumb screw can be turned 90 degrees so that the retention lock engages a structural feature of heat spreader 220. The spring provides a force compressing heat spreader 220 and liquid-cooler block 230, biasing the heat spreader 220 into thermal communication with heat-conducting cold plate 232. Engaging and disengaging securing mechanism 240 from heat spreader 220 allows liquid-cooler block to be easily removed, facilitating access to in-line memory module 210 for removal or replacement.

In other embodiments, securing mechanism 240 comprises engagement mechanism 246 which may include for example a bar, hook, or clasp; means for engaging or disengaging 242 engagement mechanism 246 which may include for example a thumb screw, toggle, sliding switch, push button, or latch; and force mechanism 244 which may include for example a spring, clamp, screw threads, magnet, or adhesive. In some embodiments, securing mechanism 240 is disposed between two heat spreaders 220, as depicted in FIG. 2. In other embodiments, securing mechanism 240 is positioned at the edges of liquid-cooler block 230. For example, in one embodiment, securing mechanism 240 is a clamp attached at an edge of liquid-cooler block 230 and a portion of a heat spreader 220 attached to an outer in-line memory module 210 included in a row of in-line memory modules.

The liquid-cooler block 230 also includes liquid inlet or outlet 238 providing an interface for tubing circulating cooling liquid, as described for system 100.

Figure 3:
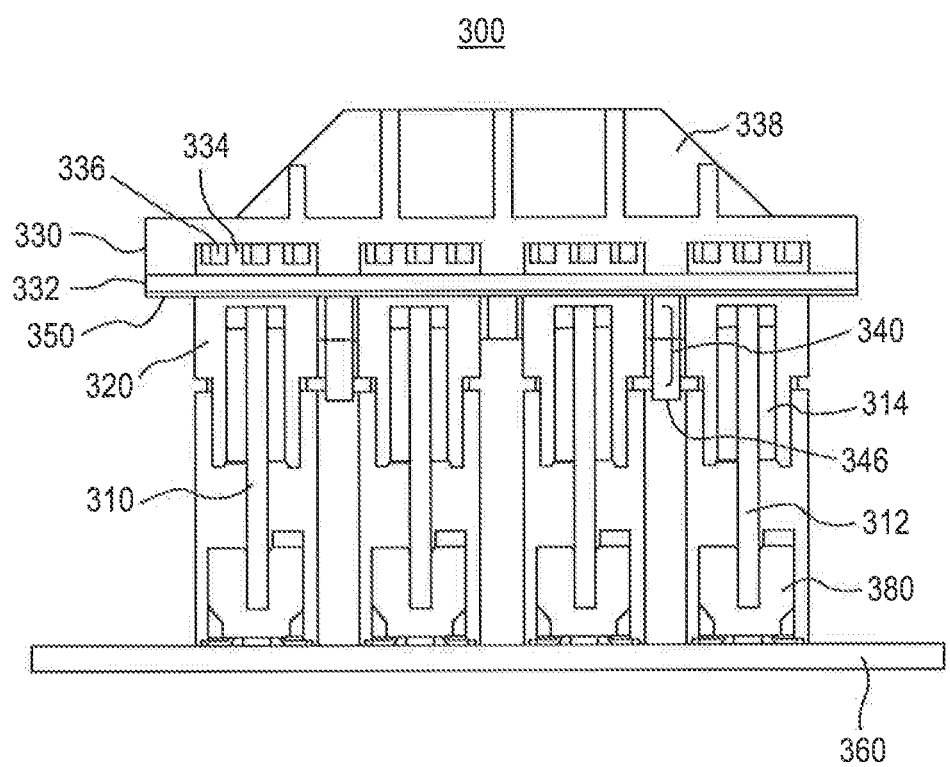
FIG. 3 illustrates a cross-section view of an embodiment of a thermal management system in accordance with one illustrative embodiment of this disclosure.

FIG. 3 is a cross-section side view of a thermal management system 300 in accordance with some embodiments of this disclosure. System 300 comprises in-line memory module 310, which includes printed circuit board 312 and IC devices 314; heat spreader 320; liquid-cooler block 330, which includes heat-conducting cold plate 332, internal liquid channel 334, breaking features 336, and a cover 338; securing mechanism 340, which includes engagement mechanism 346; and thermal interface material 350. In-line memory module 310 plugs into in-line memory module socket 380, which connects to printed circuit board 360. Elements similar to those in system 100 and 200 are as previously described in the description of those systems.

Thermal interface material 350 aids thermal communication between heat spreader 320 and the external surface of heat-conducting cold plate 332 of liquid-cooler block 330. In some embodiments, thermal interface material 350 is a thermal gap pad.

The securing mechanism 340 maintains cold plate 332 biased into thermal communication with heat spreaders 320. In some embodiments, as shown in FIG. 3, the engagement mechanism 346 is a retention lock, which can pivot 90 degrees to engage or disengage from heat spreader 320. As discussed for system 200, there are various embodiments of securing mechanism 340 and its components.

In some embodiments, in-line memory module 310 is attached to heat spreader 320, with most of the contact between heat spreader 320 and in-line memory module 310 being between heat spreader 320 and IC devices 314 of in-line memory module 310, as discussed for system 200.

In some embodiments, heat spreader 320 has means for engaging the engagement mechanism 346 of securing mechanism 340. In other embodiments, means for engaging securing mechanism 340 comprises a ledge to engage the engagement mechanism 346 of securing mechanism 340, wherein in some embodiments, engagement mechanism 346 is a retention lock, as depicted in FIG. 3. In other embodiments, means for engagement of securing mechanism 340 by heat spreader 320 includes a groove, a slot, a catch, a magnet, or adhesive. Other embodiments include any combination of engagement mechanism 346 and means of engagement by heat spreader 320 of engagement mechanism 346, such that engagement mechanism 346 is able to maintain contact with heat spreader 320 via the engagement means on heat spreader 320.

In some embodiments, liquid-cooler block 330 comprises liquid channel 334 and breaking features 336, which breaks boundary layers in the cooling liquid circulating inside the liquid channel 334. In other embodiments, thermal management system 300 sufficiently conducts heat generated by in-line memory module 310 via heat spreader 320 to heat-conducting cold plate 332 and subsequently removes the heat via the cooling liquid circulating in liquid channel 334, such that the temperature of the in-line memory module is maintained within 8 degrees Celsius above the mean temperature of the circulating liquid. Because in some embodiments, thermal management system 300 is capable of maintaining the temperature of the in-line memory module within 8 degrees Celsius above the mean temperature of the circulating liquid, the circulating liquid can be relatively not-cold. Furthermore, the liquid-cooler block can be the last component in a liquid loop which circulates cooling liquid throughout a device like a computer.

In some embodiments, the combined height of the heat spreaders and the liquid-cooler block of thermal management system 100, 200, or 300 fits in the height difference between an LP DIMM of 30 mm and a VLP DIMM of 18.75 mm.

Figure 4A:
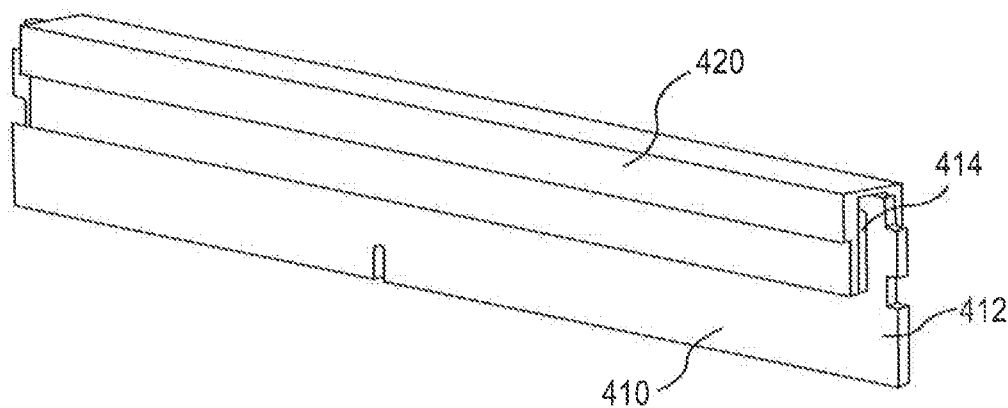
FIG. 4A illustrates a perspective view of an embodiment of an in-line memory module attached to a heat spreader.
Figure 4B:
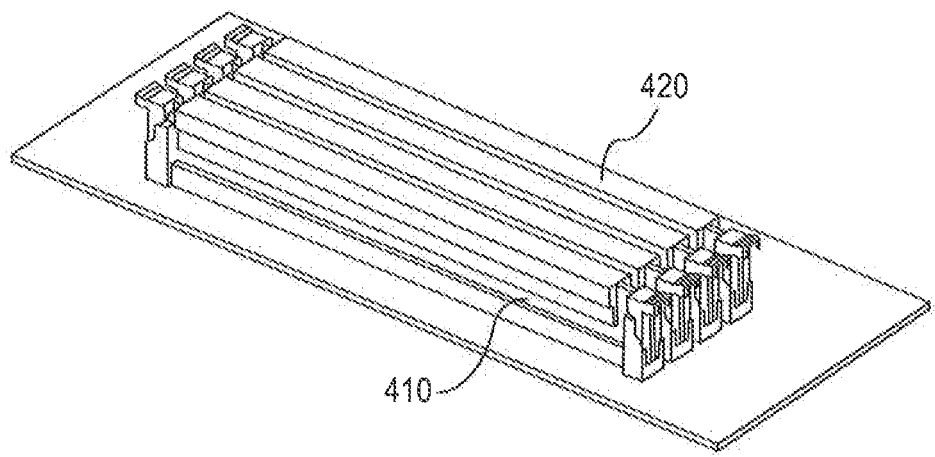
FIG. 4B illustrates a perspective view of a plurality of in-line memory modules, each having one of a plurality of attached heat spreaders, in accordance with one illustrative embodiment of this disclosure.

FIG. 4A illustrates the combination of in-line memory module 410, which includes printed circuit board 412 and IC devices 414 attached to heat spreader 420 having means for engaging a securing mechanism, as described previously. FIG. 4B illustrates a plurality of in-line memory modules 410, each with one of a plurality of heat spreaders 420 having means for engaging a securing mechanism.

Figure 5:
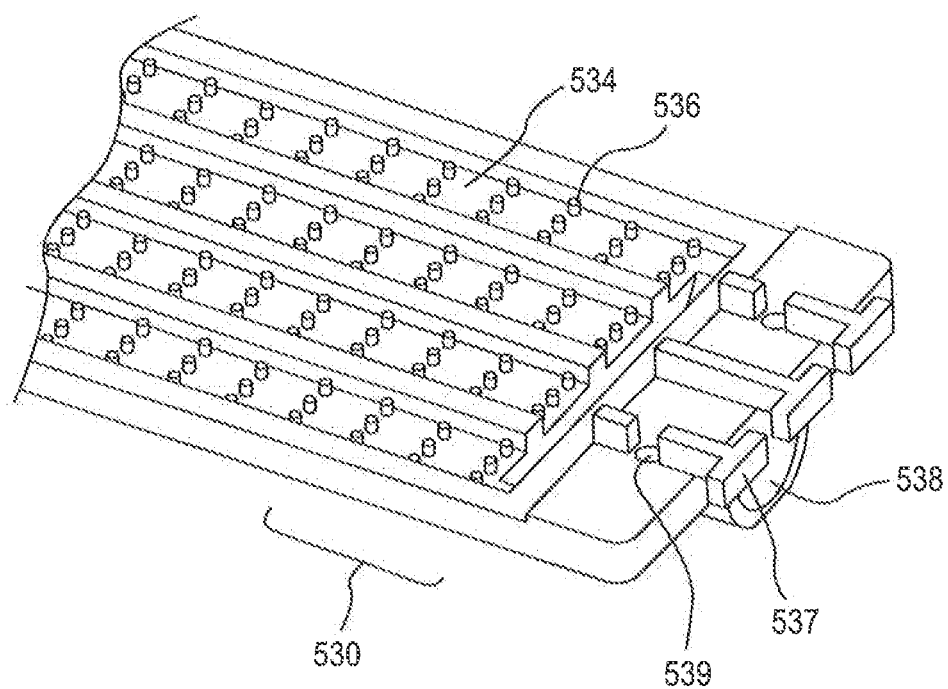
FIG. 5 illustrates a perspective view, in part, of an exemplary embodiment of liquid channels in a liquid-cooler block.

FIG. 5 illustrates internal liquid channel 534 of some embodiments of a liquid-cooler block 530 according to some embodiments. In some embodiments, internal liquid channel 534 comprises breaking features 536 to break boundary layers in the cooling liquid. Breaking boundary layers in the cooling liquid assures the walls of the liquid channels, to which heat from in-line memory modules have been transferred, comes in contact with the cooling-liquid so that the heat may be efficiently transferred to the cooling-liquid. Breaking features 536 can be of various shapes, sizes, and abundance, which introduce turbulence into the flow of a coolant within internal liquid channel 534. At the end of liquid-cooler block 530, is alignment tab 537 which aids in aligning liquid-cooler block 530 to heat spreaders attached to in-line memory modules. Arranged in hole 539 are some embodiments of securing mechanisms, as depicted for systems 200 or 300. Inlet or outlet 538 provides an interface for tubing which circulates the cooling liquid.

Figure 6A:
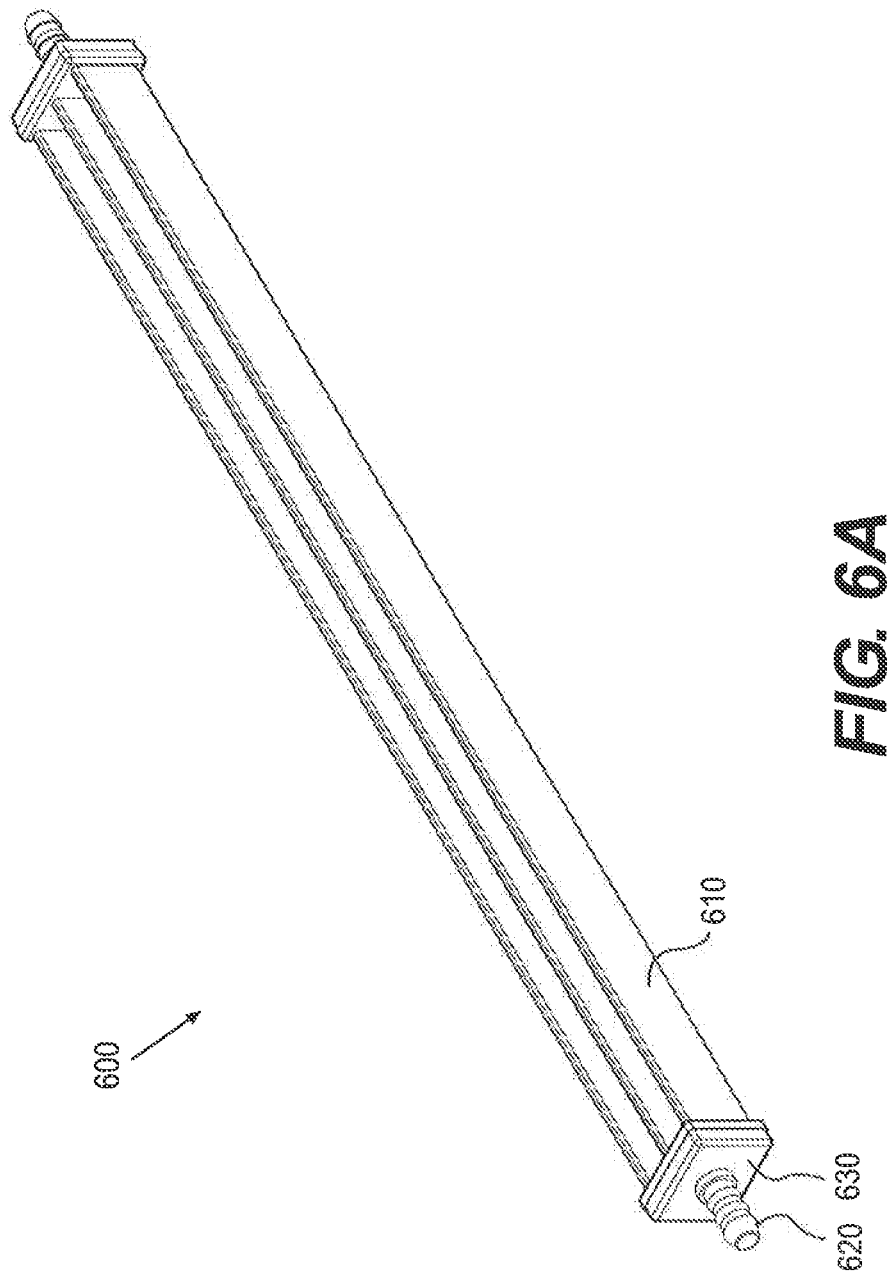
FIG. 6A illustrates a perspective view of an exemplary embodiment of an in-line memory module cooling apparatus.

FIG. 6A illustrates an illustrative embodiment of an in-memory module cooling apparatus 600 comprising a manifold comprising a plurality of parallel heat-conducting cooling tubes 610 which convey cooling liquid from one end of apparatus 600 to the other end. In-line memory modules are in thermal communication with the tubes 610. In some embodiments, a thermal adhesive is applied between the tubes 610 and the in-line memory modules to provide efficient thermal communication. As cooling liquid flows through the cooling tubes 610, which are in thermal communication with the in-line memory modules, heat generated by the memory modules transfers to the cooling tubes and then the cooling liquid. The cooling liquid transports the heat generated by the memory modules out of and away from the apparatus.

Figure 6B:
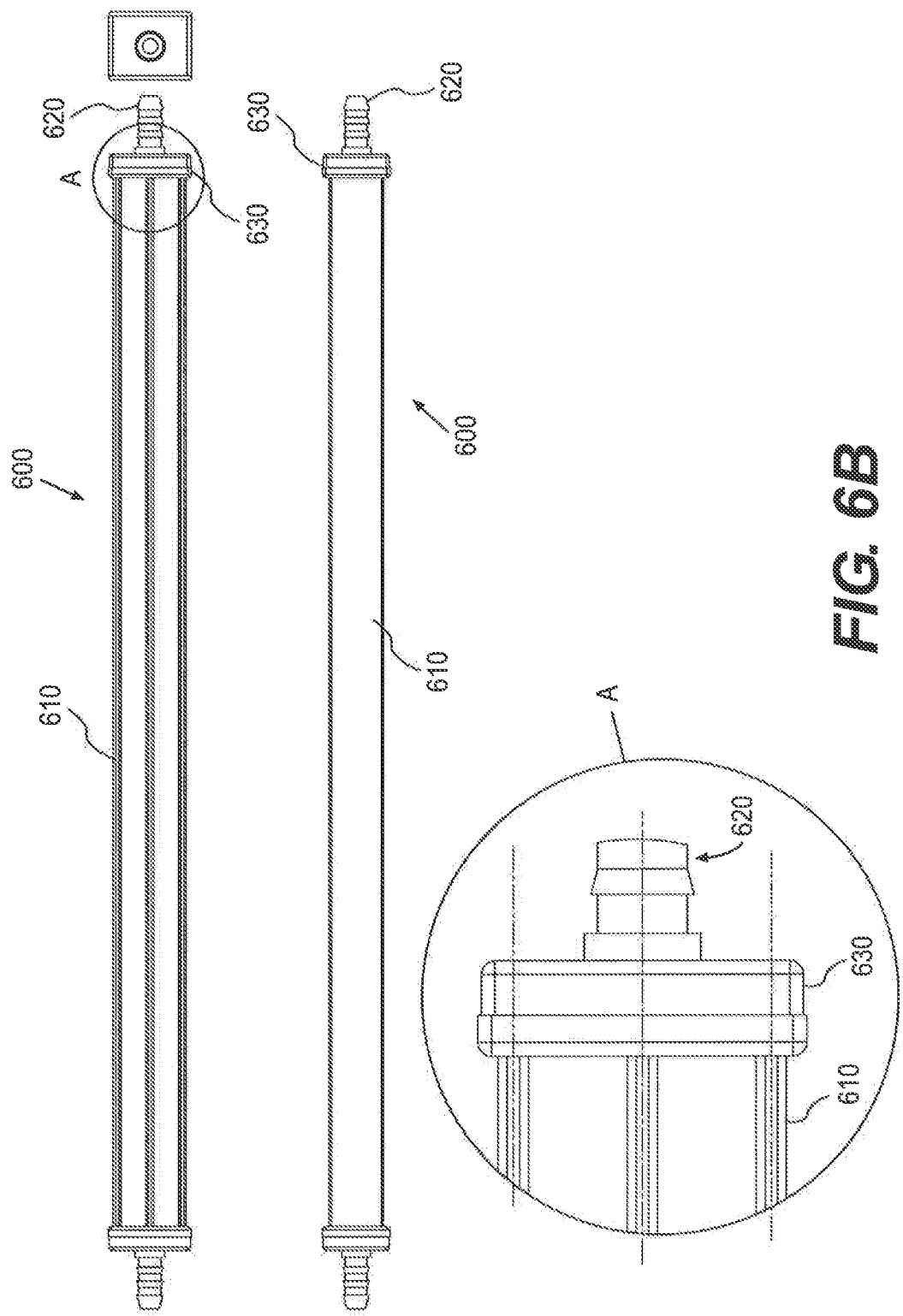
FIG. 6B illustrates side perspectives of an exemplary embodiment of an in-line memory module cooling apparatus.

In some embodiments, the tubes are made of heat-conducting material, such as aluminum. In other embodiments, the distance between two adjacent tubes fits an in-line memory module. For example, in some embodiments, as shown in FIG. 6B, the center-to-center spacing between two tubes 610 is 9.4 mm. The tubes are 2.2 mm in width. The inner distance between two tubes is 7.2 mm. In other embodiments, the tubes 610 are flat, with a height that approximates the height of the in-line memory modules. For example, in FIG. 6B, the height of the tube is 16 mm, comparable to the height of a VLF DIMM, which is 18.75 mm. In other embodiments, the cooling apparatus 600 comprises connectors 620, on either ends of the tubes, which connect to liquid loop tubing, not shown in FIGS. 6A and 6B, which conveys the cooling liquid in and out of the cooling apparatus, to other components and devices of the computer system in a liquid loop. In some embodiments, there are chambers 630 at either end of the apparatus, between the tubes 610 and the connectors 620, wherein the cooling liquid dispenses from the chambers 630, into the tubes 610, or collects into the chambers 630, from the tubes 610. In some embodiments, the connectors 620 can be a barb fitting, nipple fitting, compression fitting or any other connector familiar to one of ordinary skill in the art.

Figure 7:
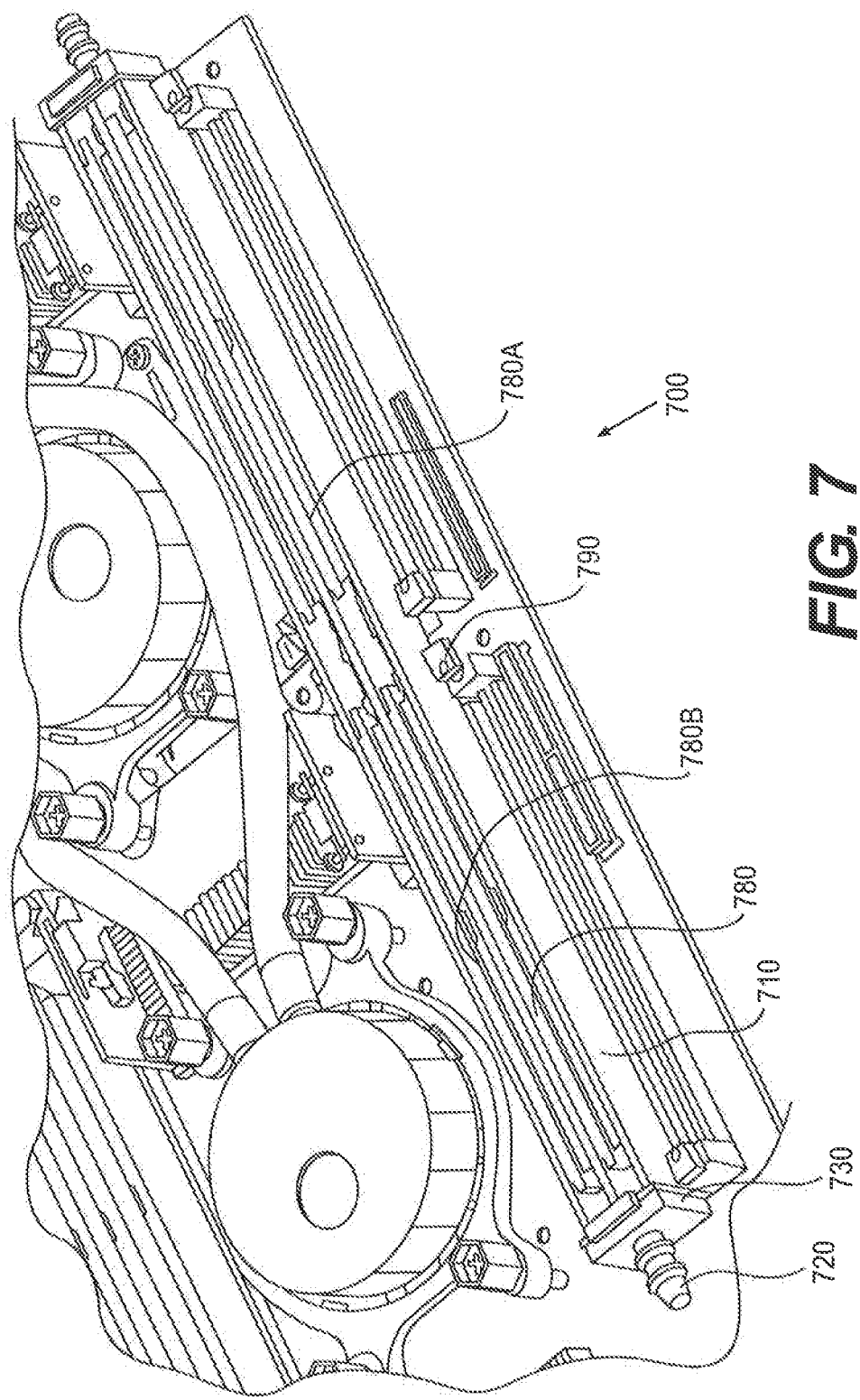
FIG. 7 illustrates a perspective view of an exemplary thermal management system in accordance with one exemplary embodiment of this disclosure.

FIG. 7 illustrates a thermal management system in accordance with one exemplary embodiment of this disclosure, including in-line memory module cooling apparatus 700 comprising a plurality of heat-conducting cooling tubes 710, with connectors 620 and chambers 630, and in-line memory modules arranged between the tubes 710. In-line memory modules 780 are plugged into memory module sockets which are connected to a motherboard. The space between the tubes of the cooling apparatus 700 also accommodates the latches of the memory module sockets 790. In some embodiments, the length of the cooling apparatus 700 spans the length of more than one memory module, as shown in FIG. 7. The tubes 710 of the cooling apparatus 700 are attached to the in-line memory modules 780 with thermal adhesive. In some embodiments, the number of in-line memory modules the cooling apparatus 700 can accommodate, length-wise, such as memory modules 780 and 780A, or width-wise, such as memory modules 780 and 780B, is variable. For instance, in the embodiment illustrated in FIG. 7, the cooling apparatus 700 can accommodate two memory modules width-wise, and two length-wise, for a total of four memory modules. Alternatives to this embodiment will be apparent to those skilled in the art. For example, in some embodiments, a cooling apparatus 700 accommodates one memory module 780, two memory modules 780, or more. Memory modules 780 may be arranged end to end within the cooling apparatus 700, as memory modules 780 and 780A are, or arranged side by side, as memory modules 780 and 780B are, or combinations of both arrangements.

It will be apparent to those skilled in the art that various modifications and variations can be made to the disclosed invention. Other embodiments will be apparent to those skilled in the art from consideration of the specification and practice of the disclosed invention. It is intended that the specification and example be considered as exemplary only, with a true scope being indicated by the following claims and their equivalents.

What is claimed is:

1. A thermal management system comprising:
   a heat spreader configured to attach to an in-line memory module;
   a liquid-cooler block having a heat-conducting cold plate comprising:
      an exterior surface;
      a plurality of internal liquid channels having a flow path in thermal communication with the cold plate, wherein the plurality of internal liquid channels are configured to receive a liquid in the flow path and wherein the flow path has a first end and a second end;
      an inlet formed in the cooling block and located at the first end of the flow path and positioned parallel with the flow path; and
      an outlet formed in the cooling block and located at the second end of the flow path and positioned parallel with the flow path, wherein the liquid-cooler block is configured so that the liquid enters the cooling block through the inlet, flows through the plurality of the internal liquid channels, and exits the cooling block through the outlet; and
   a plurality of breaking features located in the flow path of at least one of the plurality of internal liquid channels; and
   a securing mechanism configured to maintain thermal communication between the heat spreader and the exterior surface of the cold plate;
   whereby the thermal management system is configured to transfer heat generated by the in-line memory module from the heat spreader to the cold plate, for removal by the liquid circulating in the plurality of internal liquid channels.

2. The system of claim 1 further comprising a thermal interface material disposed between the heat spreader and the exterior surface of the cold plate.

3. The system of claim 1, wherein the in-line memory module is a very low profile (VLP) in-line memory module.

4. The system of claim 3, wherein the in-line memory module has a height of about 18.75 mm.

5. The system of claim 1, wherein the securing mechanism comprises at least one of a thumbscrew, a spring, or a retention lock, wherein the cold plate is biased into thermal communication with the heat spreader.

6. The system of claim 1 comprising four securing mechanisms, each including a thumbscrew, a spring, and a retention lock.

7. The system of claim 1, wherein the heat spreader has a thermal adhesive on an outer surface for contacting the in-line memory module.

8. The system of claim 2, wherein a combined height of the heat spreader, the thermal interface material, and the liquid-cooler block fits in the height difference between a low-profile in-line memory module and a standard in-line memory module.

9. The system of claim 1, wherein the thermal management system is configured to maintain a temperature of the in-line memory module, when attached to the heat spreader, that is within 8 degrees Celsius of a mean temperature of the liquid received within the flow path of the plurality of internal liquid channels.

10. The system of claim 1 wherein the liquid-cooler block further comprises tubing for circulating the liquid.

11. The system of claim 1, comprising a plurality of heat spreaders, each configured to attach to at least one in-line memory module.

12. A thermal management system comprising:
  a liquid-cooler block having a heat-conducting cold plate with an exterior surface and a plurality of internal liquid channels having a flow path in thermal communication with the cold plate, wherein, the plurality of internal liquid channels are configured to receive a liquid in the flow path;
  a plurality of breaking features located in the flow path of at least one of the plurality of internal liquid channels; and
  a heat spreader having a channel for accommodating an in-line memory module within the channel, wherein the heat spreader has a first width at a region configured to attach to the in-line memory module and a second width, greater than the first width, at a region configured to thermally contact the cold plate, wherein the difference between the first width and the second width forms a structural feature for engaging a securing mechanism and
  the securing mechanism, wherein the securing mechanism is configured to engage the structural feature and to maintain thermal communication between the heat spreader and the exterior surface of the cold plate.

13. The system of claim 12, wherein the heat spreader includes a thermal adhesive on a surface of the channel for contacting the in-line memory module.

14. The system of claim 12, wherein the thermal management system is configured to maintain a temperature of the in-line memory module, when accommodated within the channel, that is within 8 degrees Celsius of a mean temperature of the liquid received within the flow path of the plurality of internal liquid channels.

15. The system of claim 12, wherein the in-line memory module is a very low profile (VLP) in-line memory module.

16. The system of claim 15, wherein the in-line memory module has a height of about 18.75 mm.

17. The system of claim 12, comprising a plurality of heat spreaders in thermal communication with the liquid-cooler block wherein each of the plurality of heat spreaders is configured to accommodate at least one in-line memory module.

18. A thermal management apparatus, for cooling one or more in-line memory modules, comprising:
  a manifold including a plurality of parallel cooling tubes each having a first end and a second end and made of a heat-conducting material, wherein each of the plurality of cooling tubes is configured to contain a cooling liquid;
  wherein the plurality of cooling tubes are spaced apart from one another so as to receive at least one in-line memory module between adjacent cooling tubes;
  a first chamber fluidly coupled to the first ends of the plurality of cooling tubes so that each of the first ends terminates at the first chamber;
  a second chamber fluidly coupled to the second ends of the plurality of cooling tubes so that each of the second ends terminates at the second chamber;
  a first connector fluidly coupled to the first chamber for fluidly attaching the plurality of cooling tubes and the first chamber to a cooling circuit for circulating the cooling liquid through the plurality of cooling tubes, wherein the first chamber is positioned between the first connector and the plurality of cooling tubes; and
  a second connector fluidly coupled to the second chamber for fluidly attaching the plurality of cooling tubes and the second chamber to a cooling circuit for circulating the cooling liquid through the plurality of cooling tubes, wherein the second chamber is positioned between the second connector and the plurality of cooling tubes.

19. The thermal management apparatus of claim 18, wherein at least one of the plurality of cooling tubes has a thermal adhesive on an outer surface for contacting the at least one in-line memory module.

20. The thermal management apparatus of claim 18, wherein a height of each of the plurality of cooling tubes is about equal to a height of the at least one in-line memory module.

21. The thermal management apparatus of claim 18, wherein each of the plurality of cooling tubes is long enough to accommodate multiple in-line memory modules length-wise.

22. The thermal management apparatus of claim 18, wherein at least two of the plurality of cooling tubes are arranged side-by-side to accommodate multiple in-line memory modules width-wise between them.

23. A thermal management system comprising:
  a manifold including a plurality of parallel cooling tubes made of heat-conducting material, wherein each of the plurality of cooling tubes is configured to contain a cooling liquid,
  wherein the plurality of cooling tubes are spaced apart from one another so as to receive at least one in-line memory module between two of the plurality of cooling tubes, and wherein each of the plurality of cooling tubes is permanently and fluidly coupled to a chamber located at the end of the plurality of cooling tubes so that the plurality of cooling tubes each terminates at the chamber; and
  a connector fluidly coupled to the chamber for fluidly attaching the plurality of cooling tubes and the chamber to a cooling circuit for circulating the cooling liquid through the plurality of cooling tubes,
  wherein the manifold is an integrated unit configured so that the connector connects each of the plurality of cooling tubes to the fluid circuit at once.

24. The thermal management system of claim 23, wherein at least one of the plurality of cooling tubes has a thermal adhesive on an out surface for contacting the at least one in-line memory module.

25. The thermal management system of claim 23, wherein a height of each of the plurality of cooling tubes is about equal to a height of the at least one in-line memory module.

26. The thermal management system of claim 23, wherein each of the plurality of cooling tubes is long enough to accommodate multiple in-line memory modules length-wise.

27. The thermal management system of claim 23, wherein at least two of the plurality of cooling tubes are arranged side-by-side to accommodate multiple in-line memory modules width-wise between them.

28. The system of claim 1, wherein the heat spreader has a first width at a region configured to attach to the in-line memory module and a second width, greater than the first width, at a region configured to thermally contact the cold plate.

* * * * *

UNITED STATES PATENT AND TRADEMARK OFFICE
CERTIFICATE OF CORRECTION

| | | |
|---|---|---|
| PATENT NO. | : 9,158,348 B2 | Page 1 of 1 |
| APPLICATION NO. | : 13/538162 | |
| DATED | : October 13, 2015 | |
| INVENTOR(S) | : Todd Berk et al. | |

It is certified that error appears in the above-identified patent and that said Letters Patent is hereby corrected as shown below:

In the claims,

In claim 1, column 8, lines 35-36, "plurality of the internal liquid channels," should read --plurality of internal liquid channels,--.

In claim 10, column 9, line 10, "claim 1 wherein" should read --claim 1, wherein--.

In claim 12, column 9, line 19, "wherein, the plurality" should read --wherein the plurality--.

In claim 17, column 9, line 53, "block wherein" should read --block, wherein--.

In claim 23, column 10, line 34, "made of heat-conducting material," should read --made of a heat-conducting material,--.

In claim 24, column 10, line 54, "out surface" should read --outer surface--.

Signed and Sealed this
Third Day of May, 2016

Michelle K. Lee
*Director of the United States Patent and Trademark Office*